United States Patent Office 3,677,847

Patented July 18, 1972

3,677,847

PHOTOLITHOGRAPHIC ETCHING METHOD FOR NICKEL OXIDE

Alfred E. Feuersanger, Franklin Square, and Lawrence M. Harris, Brooklyn, N.Y., assignors to the United States of America as represented by the Secretary of the Army No Drawing. Filed Mar. 15, 1971, Ser. No. 124,607
Int. Cl. H05k *1/00;* H01l *7/50*
U.S. Cl. 156—8 1 Claim

ABSTRACT OF THE DISCLOSURE

A photolithographic etching method is provided for patterning a nickel oxide film on a passivated silicon substrate. The method involves applying a photoresist over the nickel oxide film, defining the desired nickel oxide pattern by a suitable masking technique, removing the photoresist from those areas not subject to the masking technique, etching away the nickel oxide film with 80 percent by volume 96 percent sulfuric acid solution at about 80 degrees C., and stripping away the remaining photoresist to expose the desired nickel oxide pattern.

This invention relates in general to the art of photolithographic etching and in particular to a photolithographic etching method for patterning a nickel oxide film on a passivated silicon substrate.

BACKGROUND OF THE INVENTION

It has been established that a film of nickel oxide can be used as a barrier layer in certain thin film structures such as a thin film capacitor to provide a high specific capacitance. A difficulty encountered with such nickel oxide films is defining a pattern in the film by a photolithographic etching method due to the extremely slow rate of etching of the nickel oxide film. That is, the slow dissolution rate causes the etchant to attack the photoresist material used in the method thereby attacking the film to be delineated in areas covered by the photoresist.

SUMMARY OF THE INVENTION

The general object of this invention is to provide a photolithographic etching method for patterning a nickel oxide film. A further object of the invention is to provide such a patterning method for a high resistivity nickel oxide film overlying a silicon substrate. A still further object of the invention is to provide a method of obtaining selective areas of thin nickel oxide films for application in hybrid silicon integrated circuits.

The method of the invention involves the application of a photoresist etch of rubbery copolymer over the nickel oxide film. The desired nickel oxide film is then defined by a suitable masking technique. The photoresist is then removed from those areas not subjected to the masking technique. The nickel oxide film is then etched away with 80 percent by volume 96 percent sulfuric acid solution at about 80 degrees C. The remaining photoresist is then stripped away to expose the desired nickel oxide pattern.

BRIEF DESCRIPTION OF THE PREFERRED EMBODIMENT

A high resistivity nickel oxide film of about 0.3 micron thickness is reactively sputtered on a silicon substrate. Conventional photoresist techniques are employed for patterning. As the etch resist, a rubber photopolymer is used which shows highest tenacity in severe acid etching, combined with high line resolution. A line grid with 85 micron line width is used as the pattern. Etching is accomplished in 80 percent by volume of 96 percent sulfuric acid solution at 80 to 100 degrees C. The film is etched down to the substrate without effecting the photoresist. The etch rate is approximately 200 angstroms per minute. These etching conditions are compatible with integrated silicon processing where the nickel oxide capacitor is prepared as the final component on the passivated silicon surface. The edge definition of the etched lines makes it possible to prepare 25 micron lines by etching the oxide film. This definition is more than sufficient for delineation and separation of the capacitor from the other circuit elements, since the value of the capacitance is not determined by the area of the film, but by the electrodes.

We wish it to be understood that we do not desire to be limited to the exact details of construction shown and described, for obvious modifications will occur to a person skilled in the art.

What is claimed is:

1. A photolithographic etching method for patterning a nickel oxide film on a passivated silicon substrate, said method including the steps of:
   (A) applying a photoresist etch of rubbery copolymer over said nickel oxide film,
   (B) defining the desired nickel oxide pattern by a suitable masking technique,
   (C) removing the photoresist from those areas not subjected to said masking technique,
   (D) etching away the nickel oxide film with 80 percent by volume 96 percent sulfuric acid solution at about 80 degrees C., and
   (E) stripping away the remaining photoresist to expose the desired nickel oxide pattern.

References Cited

UNITED STATES PATENTS

| | | | |
|---|---|---|---|
| 3,107,188 | 10/1963 | Hancock | 156—17 |
| 3,210,214 | 10/1965 | Smith | 156—8 X |

JACOB STEINBERG, Primary Examiner

U.S. Cl. X.R.

156—2, 17